United States Patent
Best et al.

(10) Patent No.: US 8,942,297 B2
(45) Date of Patent: Jan. 27, 2015

(54) FORWARDING SIGNAL SUPPLY VOLTAGE IN DATA TRANSMISSION SYSTEM

(75) Inventors: Scott C. Best, Palo Alto, CA (US); John W. Poulton, Chapel Hill, NC (US)

(73) Assignee: Rambus Inc., Sunnyvale, CA (US)

( * ) Notice: Subject to any disclaimer, the term of this patent is extended or adjusted under 35 U.S.C. 154(b) by 174 days.

(21) Appl. No.: 13/391,223

(22) PCT Filed: Mar. 30, 2010

(86) PCT No.: PCT/US2010/029252
§ 371 (c)(1),
(2), (4) Date: Feb. 17, 2012

(87) PCT Pub. No.: WO2011/025557
PCT Pub. Date: Mar. 3, 2011

(65) Prior Publication Data
US 2012/0147979 A1   Jun. 14, 2012

Related U.S. Application Data

(60) Provisional application No. 61/238,511, filed on Aug. 31, 2009.

(51) Int. Cl.
| | |
|---|---|
| H04B 7/02 | (2006.01) |
| H04L 1/02 | (2006.01) |
| G06F 13/40 | (2006.01) |
| G11C 5/14 | (2006.01) |
| H04L 25/02 | (2006.01) |

(52) U.S. Cl.
CPC ............ *G06F 13/4072* (2013.01); *G11C 5/145* (2013.01); *H04L 25/0264* (2013.01)
USPC ........................................................ 375/257

(58) Field of Classification Search
USPC .......................................................... 375/257
See application file for complete search history.

(56) References Cited

U.S. PATENT DOCUMENTS

| | | | |
|---|---|---|---|
| 6,434,044 B1 | 8/2002 | Gongwer et al. | 365/185.18 |
| 7,360,104 B2 | 4/2008 | Harris et al. | 713/300 |
| 7,459,938 B2 | 12/2008 | To et al. | 326/83 |

(Continued)

FOREIGN PATENT DOCUMENTS

| | | |
|---|---|---|
| EP | 2 009 553 A1 | 12/2008 |
| WO | WO 2008/076700 A2 | 6/2008 |

OTHER PUBLICATIONS

PCT International Search Report and Written Opinion, PCT/US2010/029252, Aug. 4, 2010, 12 Pages.

*Primary Examiner* — Tanmay Shah
(74) *Attorney, Agent, or Firm* — Fenwick & West LLP

(57) ABSTRACT

In a data transmission system, one or more signal supply voltages for generating the signaling voltage of a signal to be transmitted are generated in a first circuit and forwarded from the first circuit to a second circuit. The second circuit may use the forwarded signal supply voltages to generate another signal to be transmitted back from the second circuit to the first circuit, thereby obviating the need to generate signal supply voltages separately in the second circuit. The first circuit may also adjust the signal supply voltages based on the signal transmitted back from the second circuit to the first circuit. The data transmission system may employ a single-ended signaling system in which the signaling voltage is referenced to a reference voltage that is a power supply voltage such as ground, shared by the first circuit and the second circuit.

17 Claims, 7 Drawing Sheets

(56) References Cited

U.S. PATENT DOCUMENTS

| | | |
|---|---|---|
| 2002/0114184 A1 | 8/2002 | Gongwer et al. |
| 2006/0233279 A1 | 10/2006 | Ryder et al. |
| 2007/0008801 A1 | 1/2007 | Chiang et al. ............... 365/226 |
| 2009/0003112 A1 | 1/2009 | Zemkehr et al. |
| 2010/0327936 A1* | 12/2010 | Mosalikanti et al. ......... 327/291 |
| 2011/0239031 A1* | 9/2011 | Ware et al. .................... 713/500 |

* cited by examiner

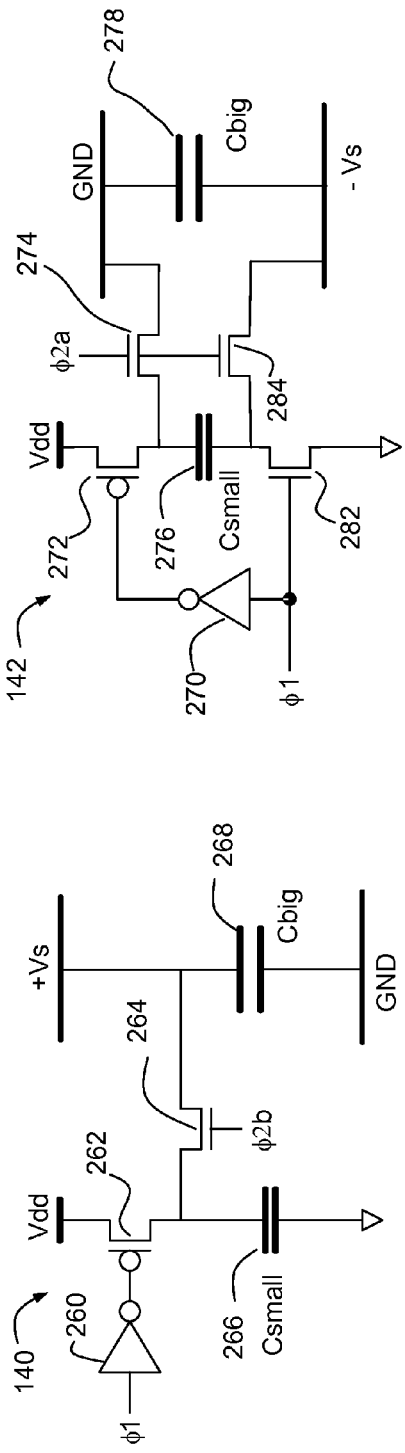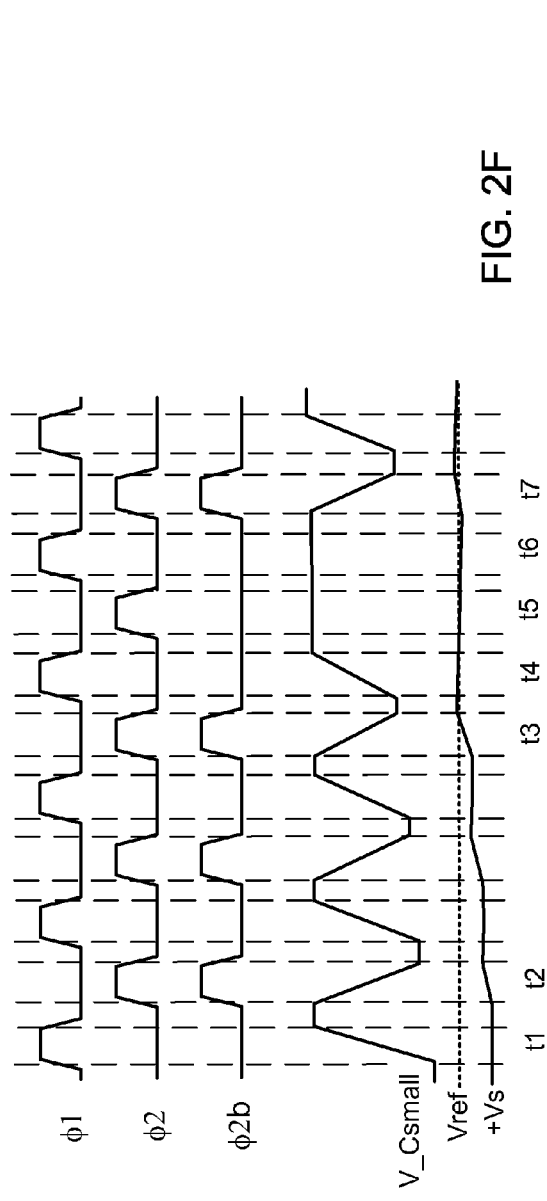

FORWARDING SIGNAL SUPPLY VOLTAGE IN DATA TRANSMISSION SYSTEM

BACKGROUND

The present disclosure relates to the generation and control of signal supply voltages for use in a data transmission system.

In a communication system, data or other information may be transmitted from one integrated circuit (IC) device to another IC device as electric signals over one or more wires. For example, a memory controller may transmit (during a "memory write" operation) data as data signals to a memory device over one or more data communication channels, while the memory device may transmit (during a "memory read" operation) data as data signals to the memory controller using the same or different data communication channels. In many instances, a signal from a transmitting device would have one or more characteristics (e.g., a signal swing) that are dependent on one or more regulated signal supply voltages. Conventionally, each IC device in a communication system obtains a power supply voltage from an external voltage regulation device. That power supply voltage is often used directly, but in some cases is regulated again, internal to the chip, to generate a signal supply voltage that determines the one or more characteristics of the signals sent to other devices. In the above example involving the memory controller and the memory device, the memory controller would include a set of internal voltage regulation circuitry to generate the regulated voltage(s) for forming the write data signals while the memory device would include another set of internal voltage regulation circuitry to generate the regulated voltage(s) for forming the read data signals.

Such arrangement would have several drawbacks. First, on-chip, internal voltage regulators or generators require relatively complex circuitry (e.g., charge pumps) and/or involve relatively large circuit components (e.g., on-chip capacitors), and thus add to the size and manufacturing cost of the IC device. Second, when the communicating IC devices have independent voltage regulators to generate their own signal supply voltage(s), the IC devices that transmit the signal would not have information to adjust one or more signal characteristics of the signal to suit the IC device receiving the signal.

BRIEF DESCRIPTION OF THE DRAWINGS

The teachings of the embodiments can be readily understood by considering the following detailed description in conjunction with the accompanying drawings.

FIGS. 2A, 2B, 2C, 2D, 2E, and 2F illustrate an example of a voltage regulator employed by the data transmission system of FIGS. 1A through 1C, according to one embodiment.

DETAILED DESCRIPTION OF EMBODIMENTS

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

The Figures (FIG.) and the following description relate to embodiments by way of illustration only. It should be noted that from the following discussion, alternative embodiments of the structures and methods disclosed herein will be readily recognized as viable alternatives that may be employed without departing from the principles of the present disclosure.

Reference will now be made in detail to several embodiments, examples of which are illustrated in the accompanying figures. It is noted that wherever practicable similar or like reference numbers may be used in the figures and may indicate similar or like functionality. The figures depict embodiments for purposes of illustration only. One skilled in the art will readily recognize from the following description that alternative embodiments of the structures and methods illustrated herein may be employed without departing from the principles of the embodiments described herein.

Embodiments of the present disclosure include a data transmission system in which one or more signal supply voltages that determine one or more signal characteristics are generated in a first circuit and forwarded (i.e., electrically driven) from the first circuit to a second circuit. The first or second circuit uses the signal supply voltages to generate signals to be transmitted to the other circuit, thereby obviating the need to generate signal supply voltages separately in the second circuit. The first circuit may also adjust the signal supply voltages based on the one or more signal characteristics of a signal transmitted back from the second circuit to the first circuit. In some embodiments, the data transmission system may employ a single-ended signaling system in which the signal supply voltages determine a signal swing of the transmitted signal One or more of these signal supply voltages may be referenced to a reference voltage, such as a power supply voltage, such as a ground voltage (GND), or another common reference voltage shared by the first circuit and the second circuit.

Figure 1A:
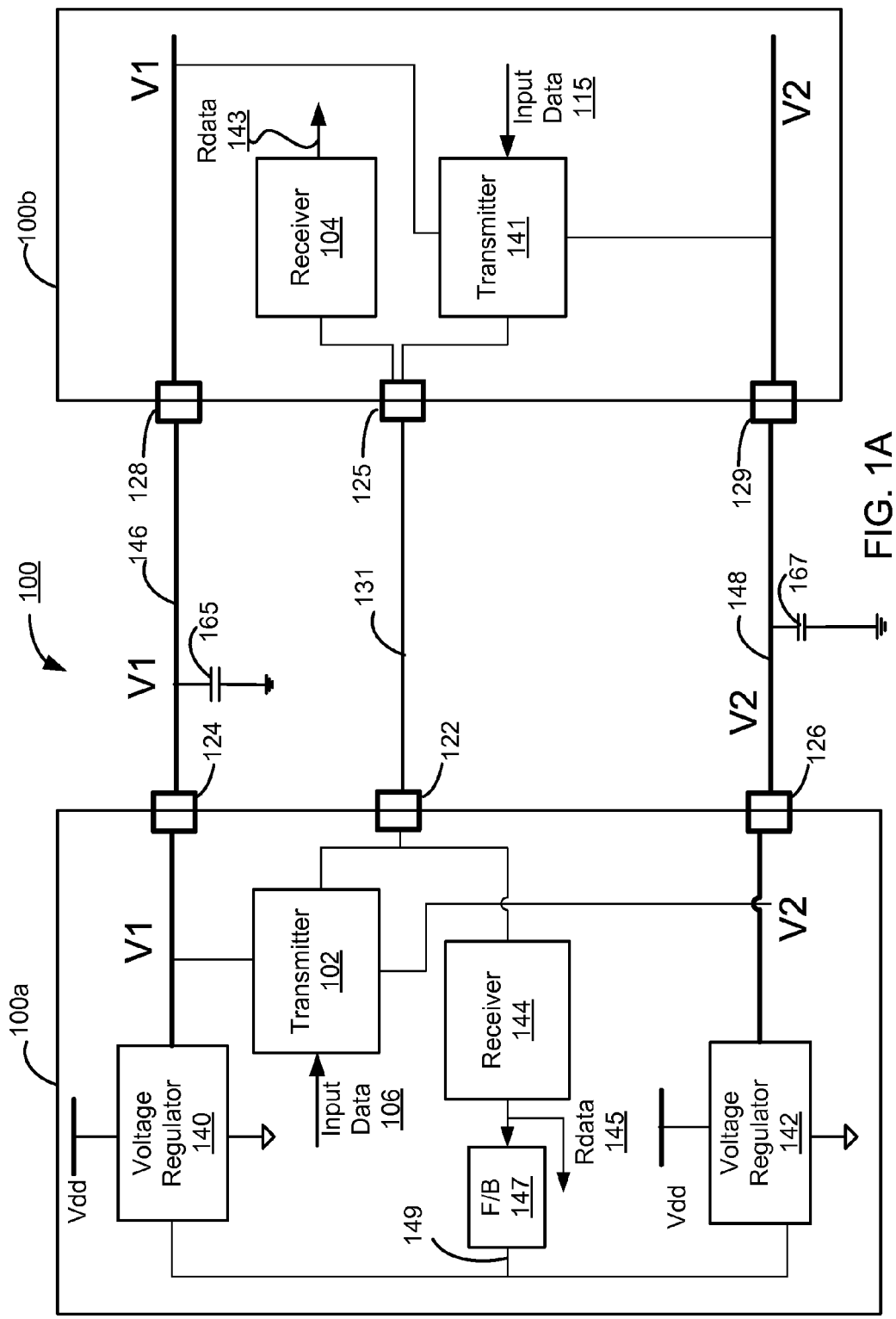
FIG. 1A illustrates a data transmission system, according to one embodiment.

Turning to the figures, FIG. 1A illustrates a data transmission system in which signal supply voltages are forwarded from one circuit to another circuit, according to one embodiment. Data transmission system 100 includes circuits 100a and 100b, communicating with each other via a communication link 131 that includes one or more transmission lines. Circuit 100a includes a transmitter 102, a receiver 144, voltage regulators 140, 142, an optional feedback analyzer circuit 147, and at least one terminal (or pin) 122 connected to communication link 131. Circuit 100b includes a receiver 104, a transmitter 141, and at least one terminals (pin) 125 connected to communication link 131. Although communication link 131 is shown to include a single transmission line in FIG. 1A and transmission system 100 is shown to use a single-ended signaling scheme, communication link 131 may include multiple transmission lines to support a different signaling scheme such as a differential signaling scheme. Furthermore, the system shown in FIG. 1A presumes a bi-directional sharing of a transmission line, where circuits 100a and 100b take turns (in a time-multiplexed fashion) being the receiver while the other acts as the transmitter. In other embodiments, non time-multiplexed unidirectional signaling using multiple signal lines may be used. Furthermore, the circuits 100a and 100b in system 100 may be electrically interconnected in a variety of ways, including via electrical traces on a circuit board (e.g., a PC motherboard or PC graphics card) or via electrical traces within the same multi-die or multi-chip package (e.g., a package-on-package (POP) assembly, or a thru-silicon via (TSV) stacked-die integrated circuit). Alternative chip-to-chip or die-to-die electrical interconnection means are readily recognized by one skilled in the art as viable alternatives that may be employed without departing from the principles of the present disclosure.

Voltage regulators 140, 142 in circuit 100a generate signal supply voltages V1, V2, respectively, which are used by transmitter 102 in circuit 100a to form a signal for transmitting to circuit 100b. In other embodiments, only one voltage regulator may be necessary to generate a single supply voltage V1, as one of the power-supply rails (e.g., GND) could be used to provide the other signal supply voltage V2. In one embodiment, system 100 further includes a voltage forwarding mechanism to forward (or drive) the signal supply voltages generated in circuit 100a to circuit 100b. The voltage forwarding mechanism may include electrical conductors 146 and 148 that are coupled to circuit 100a via terminals or pins 124 and 126, respectively, and to circuit 100b via terminals or pins 128 and 129, respectively. The forwarded voltages V1 and V2 are used by transmitter 142 to form a signal for transmitting back to circuit 100a. The data transmission system 100 allows the signal supply voltages V1, V2 to be generated on one circuit 100a and be forwarded to the other circuit 100b, thereby obviating the need to include separate voltage regulation circuitry for generating the signal supply voltages V1, V2 in circuit 100b. In one embodiment, circuit 100a is realized in a semiconductor process more amenable to complex circuits (such as is used for CPU's and memory controllers), while circuit 100b is realized in a semiconductor process optimized for very low cost production (such as is used for DRAM or Flash memory devices). Also, circuits 100a, 100b may be any other type of ICs that that communicate with each other using signals.

In one embodiment, when circuit 100a is transmitting to circuit 100b, the signal formed by transmitter 102 is transmitted via line 131, and received by receiver 104, which recovers the data (Rdata 143) from the signal. Conversely, when circuit 100b is transmitting to circuit 100a, the signal generated by transmitter 142 is transmitted back to circuit 100a via line 131 (when circuit 100a and 100b comprise a bi-directional signaling system) or a different transmission line or lines (when circuit 100a and 100b comprise a unidirectional signaling system), and received by receiver 144 of circuit 100a, which recovers the data (Rdata) 145 from the signal.

The optional feedback analyzer circuit 147 in receiver 144 is configured to analyze the characteristics of the signal received at the receiver 144, and to generate control signals 149 for adjusting the voltage level of the signal supply voltages V1, V2 generated by voltage regulators 140, 142 (in other embodiments in which one of the power supplies is used as one of the signal supply voltages, only V1 may require generation and adjustment). For example, feedback analyzer 147 may be configured such that, at system start-up, control signal 149 sets the signal supply voltages V1, V2 at levels that result in the signal swing being close to zero. Then, feedback analyzer 147 varies control signal 149 so that V1 and V2 are adjusted accordingly to gradually increase the signal swing, until the quality of the signal received has reached a desired level. Alternatively, during system start-up, the signal supply voltages V1, V2 may be set at a level so that the signal swing is larger than desired. Then, V1 and V2 may be adjusted so that the signal swing is gradually decreased, until the feedback analyzer circuit 147 determines that the quality of the signal received has become lower than desired. V1 and V2 can then be adjusted via control signal 149 so that the signal swing is brought back up slightly just to bring the quality of the signal received back to a desired level. Thus, feedback analyzer circuit 147 provides a feedback loop for generating the signal supply voltages V1, V2 using voltage regulators 140, 142, so that a desirable signal level in the signals between circuits 100a and 100b can be maintained. Using the feedback analyzer circuit 147, signals with smaller signal swings can be transmitted between the circuits 100a and 100b, resulting in increased power efficiency in system 100 and protecting receivers 104 and 144 from being damaged by overly strong input signals. Feedback analyzer circuit 147 may include, for example, a bit error rate (BER) detector that measures the bit error rate in the received signal RData 145.

In addition to allowing feedback control, as described in the previous paragraph, the data transmission system 100 of FIG. 1A has other benefits. First, as mentioned before, circuit 100b, which may be in a very cost-sensitive circuit such as a memory device (e.g., a DRAM or Flash memory circuit) than circuit 100a, does not need separate voltage regulators for generating its signal supply voltages. Thus, circuit 100b can be implemented in smaller size with simpler circuitry, and be cheaper and more power-efficient.

Second, since the signal supply voltages V1, V2 are forwarded via conductive paths (signal supply voltage rails) 146, 148, the data transmission system 100 may include external (off-chip) capacitors 165, 167 on the signal supply voltage rails 146, 148 to reduce noise that may be present in the signal supply voltages V1, V2. These external capacitors 165, 167 may have rather large capacitances, for example, about 50 pF-100 pF. Without the forwarding of the signal supply voltages via external (off-chip) connections, such large capacitors 165, 167 for reducing noise would have to be added on-chip in the circuits 100a, 100b, thereby significantly adding to the size and cost of manufacturing the circuits 100a, 100b. The external (off-chip) connection of the signal supply voltages V1, V2 allow these on-chip capacitors to be replaced by large off-chip capacitors 165, 167, thereby reducing the size and manufacturing cost of the ICs 100a, 100b significantly.

Third, in case of a deep power-down state in which the data transmission system 100 is powered off, circuit 100a can simply shut itself down without having to control circuit 100b to shut down, because circuit 100b would stop signaling when the forwarded signal supply voltages are turned off.

Figure 1B:
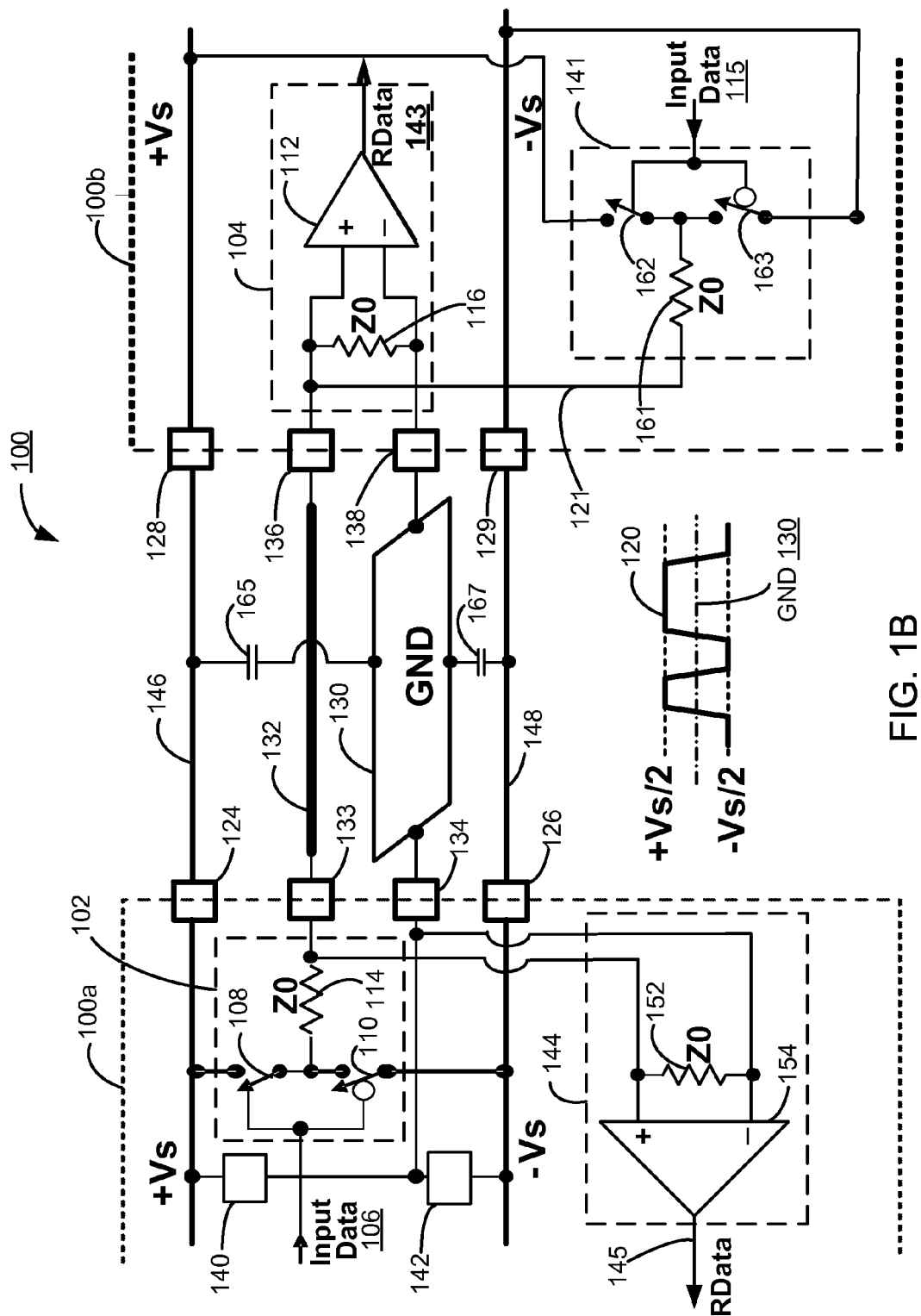
FIG. 1B illustrates a data transmission system employing power supply voltage referenced single-ended signaling with forwarding of the signal supply voltages, according to another embodiment.

FIG. 1B illustrates an embodiment of a bi-directional signaling system 100 using single ended signaling where a power supply rail (such as a ground plane) 130 is used to provide a reference voltage. In this embodiment, two signal supply rails are needed: V1=+Vs and V2=−Vs. Voltage source(s) 140 is shown as comprised of a voltage source 140 that provides +Vs and a voltage source 142 that provides −Vs. Transmitter 102 may include signal-controlled switching elements 108, 110 each coupled between a common drive node and respective signal supply voltages, +Vs and −Vs. Transmitter 102 further includes a resistive element 114 coupled between the common drive node and terminal 133 to act as a series source termination (e.g., to match a characteristic impedance, Z0, of the signal line). Thus the transmitter's internal Z0 impedance 114 and the impedance of the line 132, terminated at Z0 by termination impedance 116, form a voltage divider that splits the two supply voltages, so that the signaling voltage 120 of signal on line 132 toggles between about +Vs/2 and −Vs/2, as shown in FIG. 1B. In some embodiments, the functions of switches 108, 110 and resistor 114 may be combined in a single device, for example a MOS field effect transistor (MOSFET) operating in the linear or "triode" region of operation; in such embodiments, the linear relationship of the voltage between the drain and source terminals of the MOSFET and the current flowing between drain and source causes the device to operate in a mode approximating a resistor.

Still referring to FIG. 1B, receiver 104 may include a differential amplifier or other comparator circuit 112. Amplifier 112 amplifies the time-varying difference between the ground rail and signal potentials to produce the received data signal (RData) 143 that corresponds to the originally transmitted data 106. As shown, a termination element (depicted as resistive element 116) may be coupled between the input nodes 136 and 138 to terminate the incoming signal line according to the characteristic impedance, Z0.

In the embodiment of FIG. 1B, the GND potential is coupled to terminal (or power supply rail) 134 and is used as the reference voltage for the single-ended signaling scheme, while both +Vs and −Vs are regulated signal supply voltages forwarded from circuit 100a to circuit 100b. However, in other embodiments, +Vs may be the only regulated signal supply voltage forwarded from circuit 100a to circuit 100b, and another reference voltage (e.g., half of +Vs) may be used for the single-ended signaling scheme.

The embodiment of system 100 shown in FIG. 1B where ground referenced single-ended signaling scheme is used has several benefits. First, the GND plane 130 used as the reference voltage in IC to IC signaling systems is attached to the reference plane in IC packages and circuit boards, and is generally the lowest-impedance network in a memory system. Since the reference output terminal 134 of transmitter 102 and the reference input terminal 138 of receiver 104 are both connected to this low impedance reference node (GND plane) 130, it is relatively easy to guarantee agreement on the reference level between various components of the memory system, including transmitter 102 and receiver 104. Another advantage of the transmission system 150 is that the signal current sourced from transmitter 102 in circuit 100a flows over signaling line 132 to receiver 104 in circuit 100b and then returns to transmitter 102 through the GND plane 130 via a separate path that may be made parallel to the signaling line 132. Thus, the return current flows anti-parallel to the signal current, so the signal current and signal-return connections at the chip level are essentially differential. Thus, noise and cross-talk that would otherwise be generated by return current that is not parallel to the signal current can be avoided.

Despite the many advantages of the embodiment of system 100 shown in FIG. 1B, system 100 may employ other signaling schemes such as ones in which only a single supply voltage regulator and associated forwarding conductive path is needed, while a power supply rail (e.g., GND) is used to generate the second signal supply voltage.

Still referring to FIG. 1B, as explained above, circuit 100a includes voltage regulators 140, 142 for generating the signal supply voltages +Vs, −Vs. Circuit 100b does not include any voltage regulation circuits for generating the signal supply voltages +Vs, −Vs. Rather, the signal supply voltage +Vs is forwarded from circuit 100a to circuit 100b via terminal 124, line (supply voltage rail) 146, and terminal 128, and the signal supply voltage −Vs is forwarded from circuit 100a to circuit 100b via terminal 126, line (supply voltage rail) 148, and terminal 129. External capacitors 165, 167 for reducing noise in the signal supply voltages +Vs, −Vs can be connected to lines 146, 148 and the GND plane 130 external to the ICs 100a, 100b, thereby obviating the need for large on-chip capacitors in circuits 100a, 100b.

Circuit 100b uses the signal supply voltages +Vs, −Vs forwarded from circuit 100a to generate signaling voltages on its own transmitter 141. Specifically, transmitter 141 includes switches 162, 163 and resistor 161, and is connected to the signal supply voltages +Vs, −Vs that are forwarded from circuit 100a. Transmitter 141 generates a signal 121 that toggles between −Vs/2 and +Vs/2 and referenced to GND responsive to input data 115, similarly to transmitter 102, using the signal supply voltages +Vs, −Vs forwarded from circuit 100a.

The signal 121 generated by transmitter 141 is transmitted back to circuit 100a via terminal 136, line 132, and terminal 133, referenced to the GND plane 130, and received by receiver amplifier 144 of circuit 100a. Receiver amplifier 144 is connected to lines 132, 130 via terminals 133, 134. Receiver amplifier 144 detects the difference in voltages between the signaling voltage 121 on line 132 and the GND voltage on line 130 across resistance 152 to recover RData 145 corresponding to the input data 115.

Although the embodiment of data transmission system 100 of FIG. 1B is shown as including a pair of terminals 124, 126 and a pair of terminals 128, 129 for forwarding of the signal supply voltages +Vs, −Vs for each signal transmission line 132, it is possible for a plurality of signal transmission lines 132 to share the same forwarded signal supply voltages +Vs, −Vs. For example, it is possible for a parallel bus of 8 signal transmission lines 132 corresponding to 8-bit (or 1-byte) of data to share one pair of signal supply voltages +Vs, −Vs that are forwarded from circuit 100a to circuit 100b. The plurality of signal transmission lines 132 may also share the same ground plane for providing the reference voltage. In other embodiments, as described above, only a single supply voltage +Vs may be necessary, if the a power supply such as GND is used to generate the second signal supply voltage.

In other embodiments, the communication link 131 may include a plurality of signal transmission lines, circuit 100a may include a plurality of transmitters coupled to respective ones of the plurality of signal transmission lines, and circuit 100b may include a plurality of receivers coupled to respective ones of the plurality of signal transmission lines to receive signals transmitted by respective ones of the plurality of transmitters, and the voltage forwarding mechanism may include at least one electrical conductor coupled between the circuits 100a, 100b for each of the plurality of signal transmission lines. In still other embodiments, the plurality of signal transmission lines organized in groups, and the voltage forwarding mechanism may includes at least one electrical conductor coupled between circuits 100a, 100b for each group of the plurality of signal transmission lines. In still other embodiments, the multiple transmission lines may be organized in pairs, circuit 100a may include a plurality of transmitters coupled to the respective pairs of the signal transmission lines, and circuit 100b may includes a plurality of receivers coupled to the respective pairs of the signal transmission lines to receive signals transmitted by respective ones of the plurality of transmitters, and the voltage forwarding mechanism may includes at least one electrical conductor coupled between circuits 100a, 100b for each pair of the signal transmission lines.

Figure 1C:
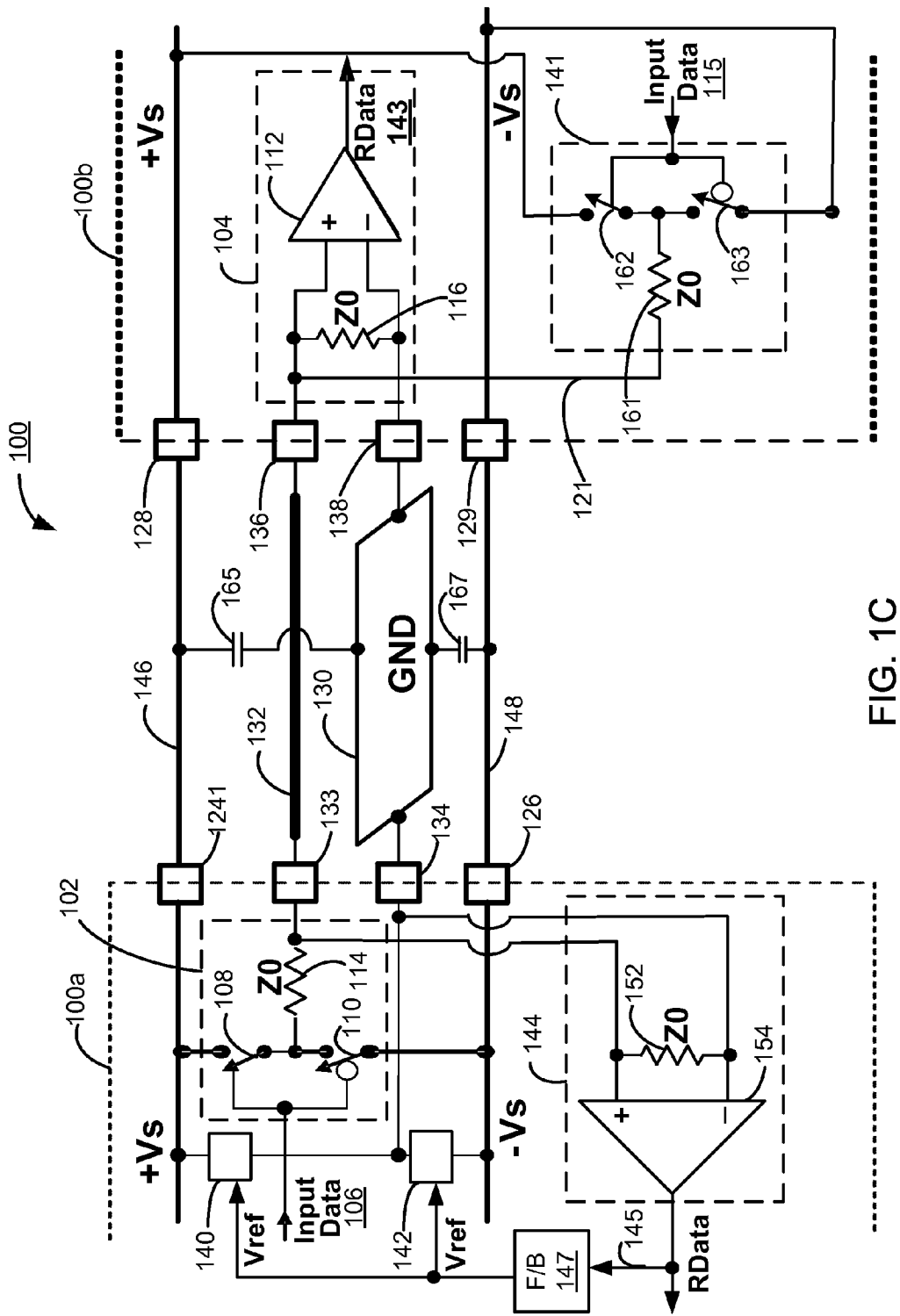
FIG. 1C illustrates a data transmission system employing power supply voltage referenced single-ended signaling with forwarding and feedback regulation of the signal supply voltages, according to still another embodiment.

FIG. 1C illustrates another embodiment of the data transmission system 100 employing power supply voltage referenced single-ended signaling with signal supply voltage forwarding and feedback regulation, according to still another embodiment. The data transmission system 100 of FIG. 1C is similar to the data transmission system 100 of FIG. 1B, except that a feedback loop comprised of a feedback analyzer circuit 147 is used in circuit 100a.

More specifically, feedback analyzer 147 receives RData 145 received from circuit 100b and determines a bit error rate of the received RData. A bit error rate (BER) refers to the number of erroneous bits in RData 145 during a time period divided by the total number of bits in RData 145 during the time period. Any conventional scheme of bit error rate detection can be used in the feedback analyzer 147 itself to detect the BER of the received RData 145 (e.g., circuit 100b could be configured to transmit a known, auto-generated PRBS pattern, and circuit 100a would be configured to count the errors in that known pattern). Since the signal supply voltages +Vs, −Vs are relatively small voltages (e.g., 100 mV, −100 mV), the signal generated by transmitter 141 using the signal supply voltage +Vs, −Vs forwarded from circuit 100a may be corrupted by normal system noise. The determined bit error rate is indication of such noise overwhelming the signal supply voltage +Vs, −Vs. When feedback analyzer 147 determines that the BER in the received data Rdata 145 is higher than desired, feedback analyzer 147 may increase a reference voltage Vref provided to voltage regulator 140, 142 such that the signal supply voltages +Vs, −Vs generated by voltage regulator 140, 142 are increased. The increased signal supply voltages +Vs, −Vs are forwarded from circuit 100a to circuit 100b, and in turn lower the BER of the signal 121 generated by transmitter 141 of circuit 100b (by providing more signal to counteract the system noise). On the other hand, feedback analyzer 147 may decrease the reference voltage Vref provided to voltage regulators 140, 142 from a higher than desired level such that the signal supply voltages +Vs, −Vs generated by voltage regulators 140, 142 and the voltage swing of the signal 121 generated by transmitter 141 are decreased from a higher than desired level to a minimal level needed to maintain an acceptable BER. Thus, the feedback analyzer 147 completes a feedback loop for the generation of the signal supply voltages by voltage regulators 140, 142 in order to maintain a desirable BER of the received RData 145 without using too large a signal swing.

Figure 2A:
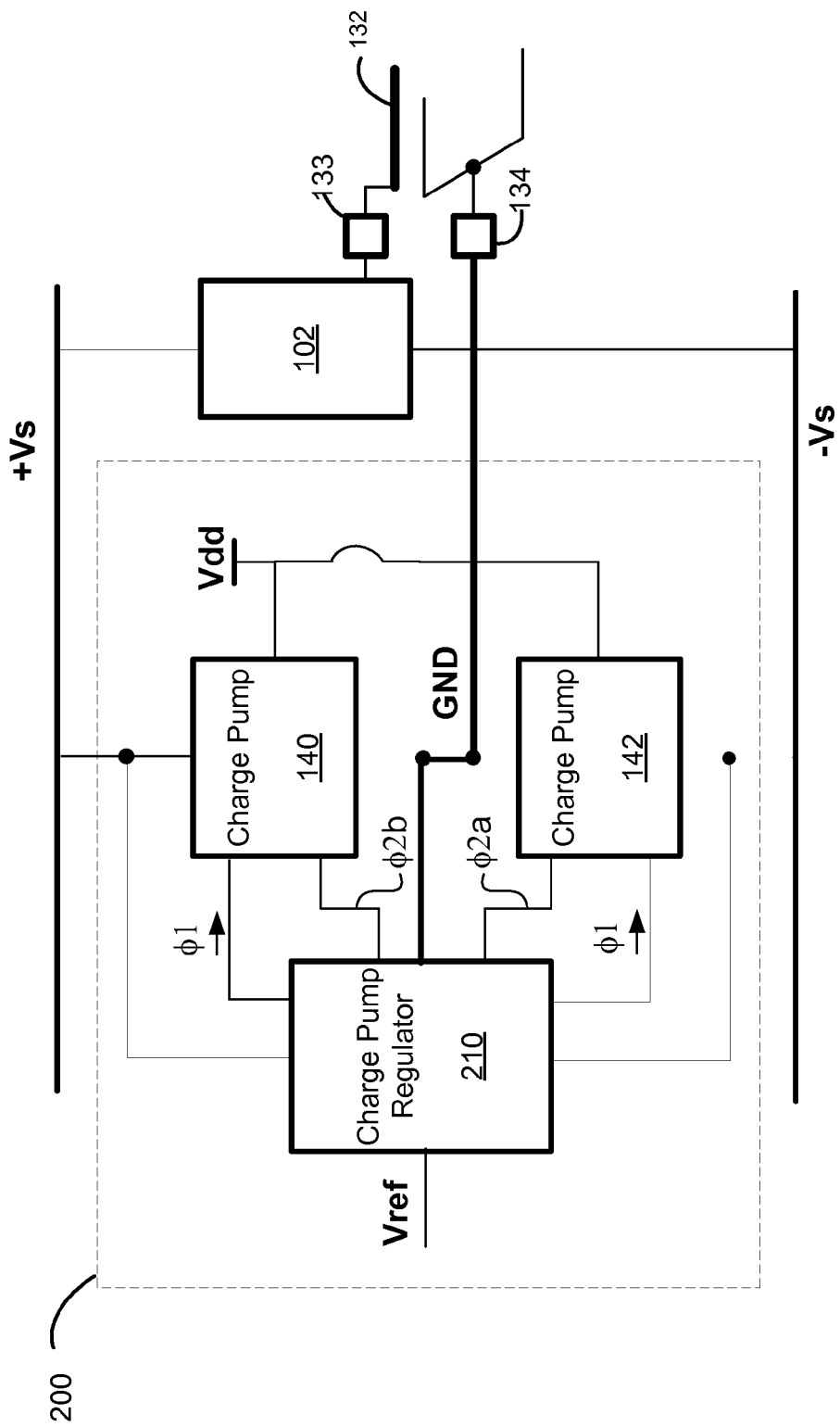

In one embodiment, voltage regulators 140, 142 are charge pumps. FIG. 2A illustrates one embodiment of a voltage source 200 that includes the charge pumps 140, 142. As shown in FIG. 2A, voltage source 200 includes charge pumps 140 and 142 for generating the signal supply voltages +Vs and −Vs, respectively, and a charge pump regulator 210. Note that charge pump regulator 210 is not shown in FIGS. 1A, 1B, and 1C for simplicity of illustration, but is present with voltage regulators 140, 142. Charge pump regulator 210 is coupled to the signal supply voltages +Vs and −Vs, and receives a reference voltage Vref that represents a desired voltage level for Vs. Charge pump regulator controls or regulates the charge pumps 140 and 142 using control signals φ2b and φ2a, respectively. Charge pumps 140 and 142 are each coupled between first and second power supply voltages (e.g., Vdd and GND), and are configured to draw current from the power supply to provide the signal supply voltages +Vs and −Vs, and to maintain the signal supply voltages +Vs and −Vs at desired levels in response to control signal 41 and to control signals φ2b and φ2a, respectively.

Figure 2C:
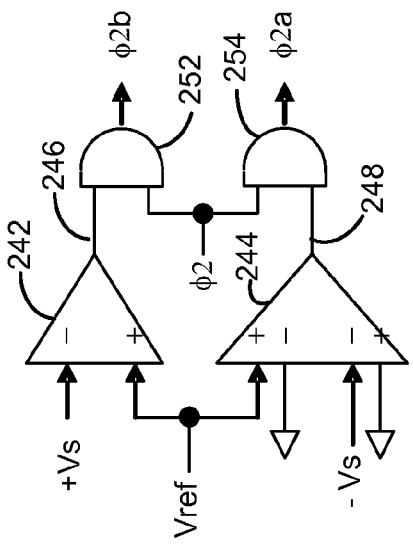
Figure 2B:
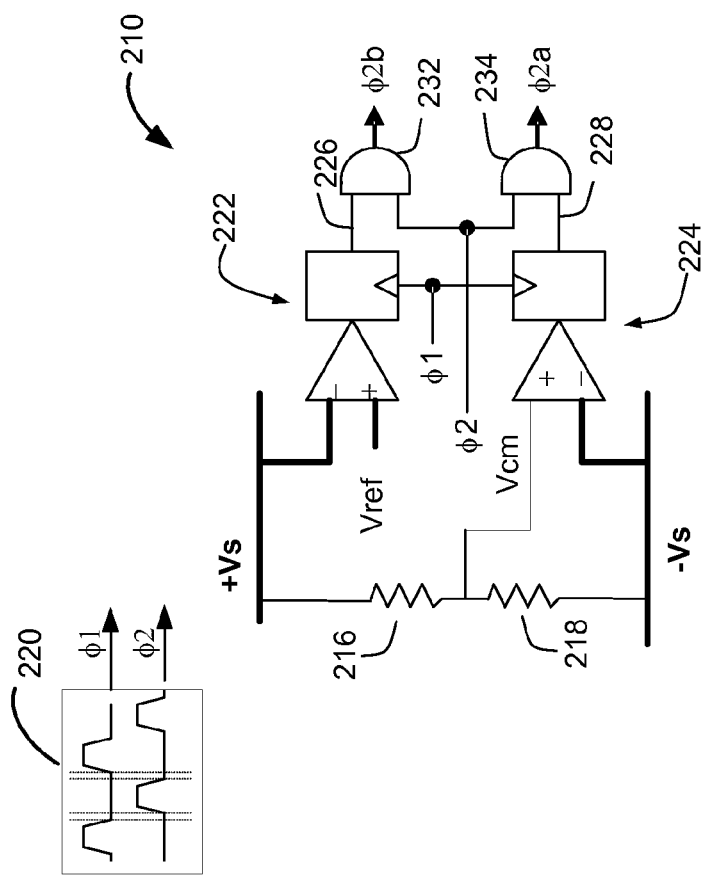

FIG. 2B illustrates an embodiment of charge pump regulator 210. As shown in FIG. 2B, charge pump regulator 210 receives a pair of non-overlapping clocks φ1 and φ2 (or, it may include a clock signal source 220 that generates the pair of non-overlapping clocks φ1 and φ2). A pair of equally sized resistors 216 and 218 divides a voltage difference between +Vs and −Vs to produce a voltage Vcm (a common-mode voltage between the positive and negative signal supply voltages). The signal supply voltages +Vs and −Vs are nominally symmetric about GND. A digital or "bang-bang" control loop including sense amplifier/latch 224 amplifies the difference (error) voltage between Vcm and GND. When the voltage on Vcm is higher than the voltage on GND, a signal on line 228 is asserted, and during the following φ2 interval, AND gate 234 outputs signal φ2a that tracks signal φ2 (i.e., signal φ2a is asserted if signal φ2 is asserted). On the other hand, if the voltage on Vcm is lower than the voltage on GND, sense amplifier/latch 224 amplifies this difference and de-asserts the signal on line 228, such that φ2a is not asserted.

Likewise, digital or "bang-bang" control loop including sense amplifier/latch 222 that amplifies the difference (error) voltage between +Vs and Vref. If the voltage on +Vs is lower than the voltage Vref, a signal on line 226 is asserted, and during the following φ2 interval, AND gate 232 outputs signal φ2b that tracks signal φ2 (i.e., signal φ2b is asserted if signal φ2 is asserted). On the other hand, if the voltage +Vs is higher than the voltage Vref, sense amplifier/latch 222 amplifies this difference and de-asserts the signal on line 226, such that φ2b is not asserted. By asserting and deasserting φ2a and φ2b based on comparison of Vcm with GND and +Vs with Vref, respectively, the signal supply voltages +Vs and −Vs can be maintained at the desired levels, as discussed below.

FIG. 2C illustrates another embodiment of charge pump regulator 210. Here, the signal supply voltage +Vs is fed back into comparator 242 for comparison with the reference voltage Vref. The output 246 of comparator 242 is asserted if +Vs is smaller than Vref. Thus, the output φ2b of AND gate 252 follows the clock signal φ2 when +Vs is lower than Vref and is not asserted otherwise. Likewise, the signal supply voltage −Vs is fed back into window comparator 244 for comparison with the reference voltage Vref. The output 248 of window comparator 244 is asserted if the difference between GND and −Vs is smaller than the difference between Vref and ground (i.e., GND−(−Vs)<Vref−GND, or Vs is smaller than Vref). Thus, the output φ2a of AND gate 254 follows the clock signal φ2 when the difference between GND and −Vs is smaller than the difference between Vref and GND. Otherwise, it is not asserted.

FIGS. 2D and 2E illustrate embodiments of charge pumps 140 and 142, respectively. Referring to FIG. 2D, charge pump 140 includes a switching device 262 (shown as a P-type metal-oxide-semiconductor (MOS) field effect transistor (PFET)) that is turned on or off according to clock signal φ1, and a switching device 264 (shown as an N-type MOS field effect transistor (NFET)) that is turned on or off according to clock signal φ2b. Charge pump 140 further includes a capacitor 266 and a capacitor 268. Capacitor 266 has a much smaller capacitance than that of capacitor 268 and is therefore sometimes referred to as Csmall, while capacitor 268 is sometimes referred to as Cbig. Cbig 268 is coupled between +Vs and GND, so the voltage across capacitor 268 is the signal supply voltage +Vs.

FIG. 2F is timing chart showing signals φ1, φ2, φ2b, the voltage across capacitor 266 (V_Csmall), and the voltage across capacitor 268 (+Vs) in comparison with Vref during a series of time periods after IC device including the charge pumps is turned on. As shown in FIG. 2F, during time period t1, when φ1 is asserted, switch 262 is turned on, allowing charge to flow from Vdd to capacitor 266, so that a voltage across capacitor 266, V_Csmall, increases to a level between Vdd and GND. The voltage across Cbig is lower than Vref so φ2b is tracking φ2. During time period t2, when φ1 is de-asserted while φ2 and thus φ2b is asserted, switch 262 is turned off while switch 264 is turned on, so that stored charge in Csmall is shared with Cbig and the voltage across capacitor 268, +Vs, increases while V_Csmall decreases.

Since the capacitance of Csmall is much smaller than the capacitance of Cbig, and the increase in voltage across Cbig during time period t2 is much smaller than the decrease in voltage across Csmall, so the voltage across Cbig at the end of time period t2 is slightly higher than the voltage across Cbig at the start of time period t2. The above charging of Csmall and subsequent charging of Cbig may repeat in response to signals φ1 and φ2b, until the signal supply voltage +Vs reaches or is higher than Vref at the end of time period t3. As discussed above, as long as +Vs remains at or above Vref during time periods t4 and t4, φ2b is not asserted, meaning switch 264 does not turn on and Cbig does not get further charged by Csmall. When +Vs drops below Vref during time period t6, φ2b follows φ2 again in time period t7, and charges from Csmall will be shared with Cbig until +Vs is higher than Vref again.

The signal and voltage curves shown in FIG. 2F are for illustrative purposes only and are not to replicate or scale with signals or voltages in a real IC device. In some embodiments, the voltage between Vdd and GND is much higher than Vref. For example, Vdd may be about 1 volt, while Vref is about 0.1 volt. In such case, if the charge pumps run at a frequency of, for example, 1 GHz, data is being driven out at, for example, 4 Gbps, and the impedance of transmitter 102 (thus the impedance of the load) is, for example, 50 ohms, Csmall can be about 0.75 pF to about 1.25 pF while Cbig can be about 50 pF to about 250 pF.

On the other hand, charge pump 142 includes switches 272, 282 that are turned on or off according to clock signal φ1, and switches 274, 284 that are turned on or off according to clock signal φ2a. Charge pump 214 further includes a capacitor Csmall 276 and a capacitor Cbig 278. Cbig 278 is coupled between GND and −Vs so the voltage across Cbig 278 is the signal supply voltage −Vs. Switches 272, 282 are turned on when clock signal φ1 is asserted so that charge is extracted from power supply Vdd via switch 272 and 282 and stored in capacitor Csmall 212. Switches 274 and 284 are turned on when signal φ2a is asserted and signal φ1 is de-asserted, so charges stored in Csmall is pumped into Cbig. This process repeats until the common mode voltage Vcm is lower than GND, or the difference between GND and Vs is larger than the difference between Vref and GND. As discussed above in association with FIGS. 2B and 2C, as long as the common mode voltage Vcm remains lower than GND, or the difference between GND and Vs remains larger than the difference between Vref and GND, φ2a remains de-asserted and no charge is pumped from Csmall 276 to Cbig 278 to further increase the voltage across Cbig 278. When the common mode voltage Vcm becomes higher than GND, or the difference between GND and Vs becomes smaller than Vref, φ2a follows φ2 again and Cbig 278 gets charged from Csmall until Vcm becomes lower than GND, or the difference between GND and Vs becomes larger than the difference between Vref and GND again.

FIGS. 2D and 2E show that switches 262 and 272 are implemented using P-type metal-oxide-semiconductor field effect transistors (P-MOSFET or PFET), while switches 264, 274, 282 and 284 are implemented using N-type MOSFETs (NFET). PFET 262 or 272 is turned on when φ1 is asserted by virtue of inverter 260 or 270, respectively, which inverts the sense of φ1 to drive the gate terminal of PFET 262 or 272. Those skilled in the art will easily understand that other types of switches can be used in place of the MOSFETs. The capacitors 266, 268, 276, and 278 may be implemented using MOS capacitors, but other types of capacitors can alternatively be employed.

The embodiments of FIGS. 2A through 2F are shown by way of examples. There are many other possible embodiments of on-chip voltage sources or regulators. For example, some embodiments may have additional Csmall capacitors and additional switches that charge these Csmall capacitors in a series circuit arrangement and discharge the Csmall capacitors in a parallel arrangement, thereby providing higher overall efficiency than that of the simple charge pumps of FIGS. 2D and 2E. In a further example, instead of using clocks to gate the MOSFETs on and off in the charge pumps, other type of switches that respond to other characteristics of control signals such as frequency, amplitude or duty cycle of the control signals may be used. In yet another example, switched capacitors may be used in place of the switch and capacitor combinations in the charge pumps. In still other examples, other regulating means such as a linear regulator or switching regulator may be used to control the signal supply voltages.

In one embodiment, charge pumps 140 and 142 are implemented with components having substantially the same efficiency. In the embodiment shown in FIG. 2A, charge pump 140 draws current from Vdd when transmitter 102 is transmitting "1"s while charge pump 142 draws current from Vdd when transmitter 102 is transmitting "0"s. Thus, assuming that the transmitter 102 has matching impedance with the transmission lines 132, 130, the transmitter 102 draws approximately the same amount of supply current from the power supply regardless of which way the transmitter 102 is driving the current (i.e., sourcing current from transmitter 102 to receiver 104, or sinking current from receiver 104 to transmitter 102). Thus, to the extent that charge pumps 140 and 142 have about the same efficiency, the complementary configuration of the voltage source(s) 140 ensures that supply current variation in signaling system 100 is near zero, thereby reducing or eliminating simultaneous switching noise (SSO) inherent in conventional single-ended signaling schemes.

The embodiments of FIG. 2A through 2F are shown by way of example only. There are many other possible embodiments of on-chip voltage regulators.

Figure 3:
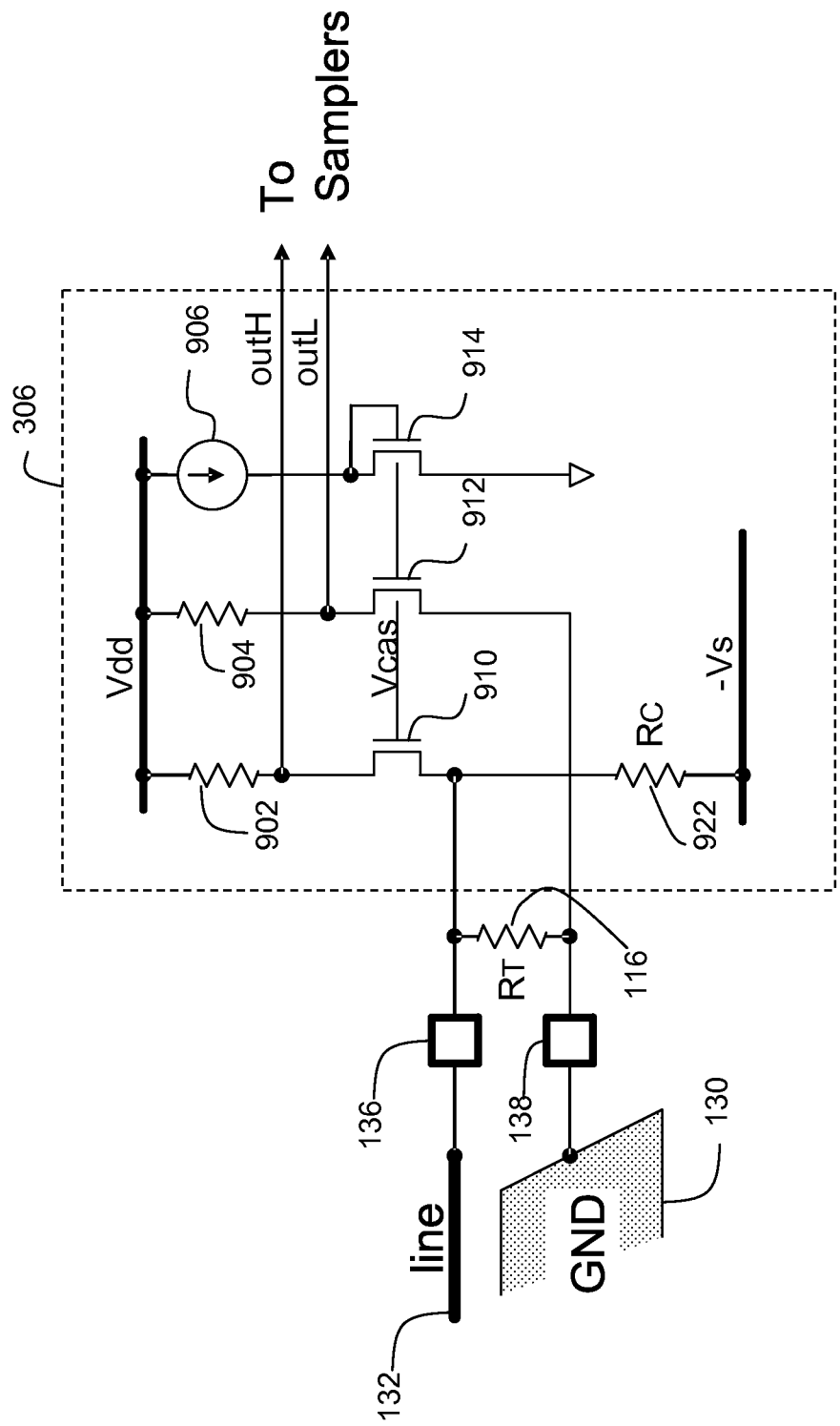
FIG. 3 illustrate a receiver amplifier suitable for use in the data transmission system of FIGS. 1A through 1C, according to one embodiment.

FIG. 3 illustrates an example of a common-gate amplifier that can be used as the receiver amplifier(s) in the data transmission system of FIGS. 1A through 1C when GND is chosen as the reference voltage, according to one embodiment. Current source 906 establishes a reference current in NFET 914, thereby generating gate reference voltage Vcas. NFETs 910 and 912, which are the amplifying transconductances in amplifier 306, are drawn at the same shape factor (width/length) as 914 so that they carry about the same current as 914, when their inputs, driven into their source terminals, attached to pins 136 and 138, are at substantially the same potential, since in this case the gate-to-source voltages (Vgs) for all three transistors are substantially equal and the shape factors are identical. The data signal, attached to pin 136, is compared in amplifier 306 with the signal reference voltage, input on pin 138 from the power supply GND plane 130. The current from line to GND develops a voltage across termination resistor 116; this voltage swings from about +Vs/2 to about −Vs/2. When the voltage on line (pin 136) is higher than the voltage on GND (pin 138) NFET 910's Vgs is less than Vgs at NFET 912. Therefore, less current flows through 910 and through 912, and the voltage drop through load resistor 902 is smaller than the voltage drop through load resistor 904. This causes the voltage on outH to rise above the voltage on outL. On the other hand, if the voltage on 136 is lower than the voltage on 138, then NFET 910's Vgs is greater than Vgs for NFET 912. Consequently NFET 910 carries more current than 912, and the voltage across 902 is larger than the voltage across 904. In this case, the voltage on outH is less than the voltage on outL. Under these circumstances the current driven back into line 132 (pin 136) by NFET 910 is larger than the current driven into the line 132 by 910 when the voltage on line exceeds the voltage on GND. To prevent this current unbalance from introducing an unwanted voltage offset in amplifier 306, a compensating resistor 922, RC, is used to return some of the current to the negative power supply −Vs.

Still referring to FIG. 3, the magnitude of the voltage between outH and outL is higher than the magnitude of the voltage between line (pin 136) and GND (pin 138) thanks to the gain of amplifier 306; the gain of amplifier 306 is about Gm×RL, where Gm is the transconductance of NFETs 910 and 912, and RL is the resistance of load resistances 902 and 904.

Still referring to FIG. 3, the terminating impedance presented across pins 136 and 138 is the parallel combination of the terminating resistor RT 116, the compensating resistor RC 922, and the input impedance of the amplifier, which is about 1/Gm, where Gm is the transconductance of transistors 910 and 912. This parallel combination of resistances should be adjusted to about the characteristic impedance of the transmission line formed by line 132 and GND to avoid reflections in the transmission line.

The foregoing embodiment of the input amplifier is shown by way of example. Many alternative embodiments of input amplifiers can be employed in receiver 104 or 144 in system 100.

Upon reading this disclosure, those of skill in the art will appreciate still additional alternative designs for forwarding signal supply voltages in a data transmission system. Thus, while particular embodiments and applications have been illustrated and described, it is to be understood that the disclosure herein is not limited to the precise construction and components disclosed herein and that various modifications, changes and variations may be made in the arrangement, operation and details of the method and apparatus disclosed herein without departing from the spirit and scope of the disclosure herein.

What is claimed is:

1. A data transmission system, comprising:
    a communication link;
    a voltage forwarding mechanism;
    a first circuit coupled to one side of the communication link, the first circuit including a first transmitter and one or more voltage regulators configured to generate at least one signal supply voltage, the first transmitter configured to transmit a first signal onto the communication link, the first signal having a signal swing dependent on the at least one signal supply voltage; and
    a second circuit coupled to another side of the data communication link, the second circuit including a receiver to receive the first signal from the communication link and a second transmitter, the second transmitter configured to transmit a second signal onto the data communication link, the second signal having a signal swing dependent on the at least one signal supply voltage, the at least one signal supply voltage being forwarded from the first circuit to the second circuit by the voltage forwarding mechanism.

2. The data transmission system of claim 1, wherein:
    the at least one signal supply voltages include first and second voltages and the voltage forwarding mechanism includes first and second electrical conductors coupled between the first and second circuits, the first voltage and the second voltage being forwarded from the first circuit to the second circuit via the first and second electrical conductors, respectively.

3. The data transmission system of claim 1, wherein:
    the communication link includes a plurality of signal transmission lines, the first circuit includes a plurality of transmitters coupled to respective ones of the plurality of signal transmission lines, and the second circuit includes a plurality of receivers coupled to respective ones of the plurality of signal transmission lines to receive signals transmitted by respective ones of the plurality of transmitters; and
    the voltage forwarding mechanism includes at least one electrical conductor coupled between the first and second circuits for each of the plurality of signal transmission lines.

4. The data transmission system of claim 1, wherein:
    the communication link includes a plurality of signal transmission lines organized in groups, the first circuit includes a plurality of transmitters coupled to respective ones of the plurality of signal transmission lines, and the second circuit includes a plurality of receivers coupled to respective ones of the plurality of signal transmission lines to receive signals transmitted by respective ones of the plurality of transmitters; and
    the voltage forwarding mechanism includes at least one electrical conductor coupled between the first and second circuits for each group of the plurality of signal transmission lines.

5. The data transmission system of claim 1, wherein
    the communication link includes multiple pairs of signal transmission lines, the first circuit includes a plurality of transmitters coupled to respective pairs of the signal transmission lines, and the second circuit includes a plurality of receivers coupled to respective pairs of the signal transmission lines to receive signals transmitted by respective ones of the plurality of transmitters; and
    the voltage forwarding mechanism includes at least one electrical conductor coupled between the first and second circuits for each pair of the signal transmission lines.

6. The data transmission system of claim 1, wherein the first signal is referenced to a power supply voltage and swings substantially symmetrically with respect to the power supply voltage.

7. The data transmission system of claim 6, wherein the power supply voltage is a ground voltage.

8. The data transmission system of claim 1, wherein the first circuit further includes:
    a receiver configured to receive the second signal; and
    a feedback analyzer circuit configured to detect a parameter indicative of signal integrity of the second signal, said one or more voltage regulators adjusting the at least one signal supply voltage according to the parameter.

9. The data transmission system of claim 8, wherein said one or more voltage regulators are configured to adjust the at least one signal supply voltage so as to increase the signal swing of the first signal responsive to increased noise in the second signal.

10. The data transmission system of claim 8, wherein the feedback analyzer circuit is a bit error rate detection circuit and the parameter is a bit error rate of the second signal.

11. The data transmission system of claim 1, wherein the first circuit is a memory controller and the second circuit is a memory device.

12. The data transmission system of claim 1, where the first circuit and the second circuit are electrically connected using thru-silicon via die-to-die attachment technology.

13. The data transmission system of claim 1, where the first circuit and the second circuit are electrically connected using stacked package-on-package assembly technology.

14. In a first circuit, a method of transmitting a signal via a communication link, the method comprising:
   generating at least one signal supply voltage;
   forwarding the at least one signal supply voltage to a second circuit external to the first circuit via a voltage forwarding mechanism;
   generating the signal with a signal swing dependent on the at least one signal supply voltage; and
   transmitting the signal to the second circuit via the communication link.

15. The method of claim 14, further comprising:
   receiving another signal transmitted by the second circuit;
   detecting a parameter indicative of signal integrity of said another signal transmitted by the second circuit; and
   adjusting the at least one signal supply voltage according to the parameter.

16. The method of claim 15, wherein the at least one signal supply voltage is adjusted so as to increase the signal swing of the signal responsive to increased noise in said another signal.

17. In a first circuit, a method of transmitting a signal over a communication link, the method comprising:
   receiving at least one signal supply voltage forwarded from a second circuit external to the first circuit via a voltage forwarding mechanism;
   generating the signal with a signal swing dependent on the at least one signal supply voltage; and
   transmitting the signal to the second circuit via the communication link.

* * * * *